United States Patent [19]

Hijikata et al.

[11] Patent Number: 5,630,886
[45] Date of Patent: May 20, 1997

[54] CORROSION-RESISTANT FILM FOR PROTECTING SURFACES OF AG AND CORROSION-RESIST COMPOSITE STRUCTURES

[75] Inventors: Kenichi Hijikata; Rie Mori, both of Omiya, Japan

[73] Assignee: Mitsubishi Materials Corporation, Tokyo, Japan

[21] Appl. No.: 519,025

[22] Filed: Aug. 24, 1995

[30] Foreign Application Priority Data

Aug. 29, 1994 [JP] Japan .................. 6-203875

[51] Int. Cl.$^6$ ............... C23C 8/10; G11B 11/10
[52] U.S. Cl. .............. 148/277; 148/281; 148/285; 359/884
[58] Field of Search ................. 428/673, 629; 359/884; 148/277, 281, 285

[56] References Cited

U.S. PATENT DOCUMENTS

| | | | |
|---|---|---|---|
| 2,784,123 | 3/1957 | Rappaport | 148/281 |
| 3,379,566 | 4/1968 | Hannam | 148/277 |
| 5,076,663 | 12/1991 | Arendt | 359/884 |
| 5,284,527 | 2/1994 | Smeggil | 148/281 |

FOREIGN PATENT DOCUMENTS 0512516  9/1939  United Kingdom ............ 148/281

*Primary Examiner*—Sam Silverberg
*Attorney, Agent, or Firm*—Oblon, Spivak, McClelland, Maier & Neustadt, P.C.

[57] ABSTRACT

Disclosed is a corrosion-resistant film for protecting the surfaces of Ag, which comprises an Ag—Mg alloy having an Mg content of from 1 to 10 atomic % and which is applied to an Ag substrate. Also disclosed is a corrosion-resistant composite structure composed of an Ag substrate and a protective film of an Ag—Mg alloy with an Mg content of from 1 to 10 atomic % formed on the surface of the Ag substrate. The corrosion-resistant film protects an Ag with a silver-white gloss from being blackened by sulfide components, etc. The adhesiveness between the film and the Ag substrate is good. The composite structure has a high reflectivity and is useful as a reflective film for photomagnetic recording media, optical recording media, reflectors, illuminators, etc. The surface of the corrosion-resisting film is oxidized to form an MgO layer on the film, and the film exhibits a high protecting effect.

7 Claims, 6 Drawing Sheets

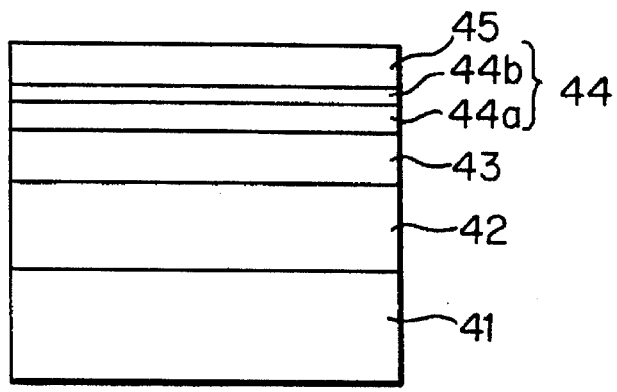
FIG. 5
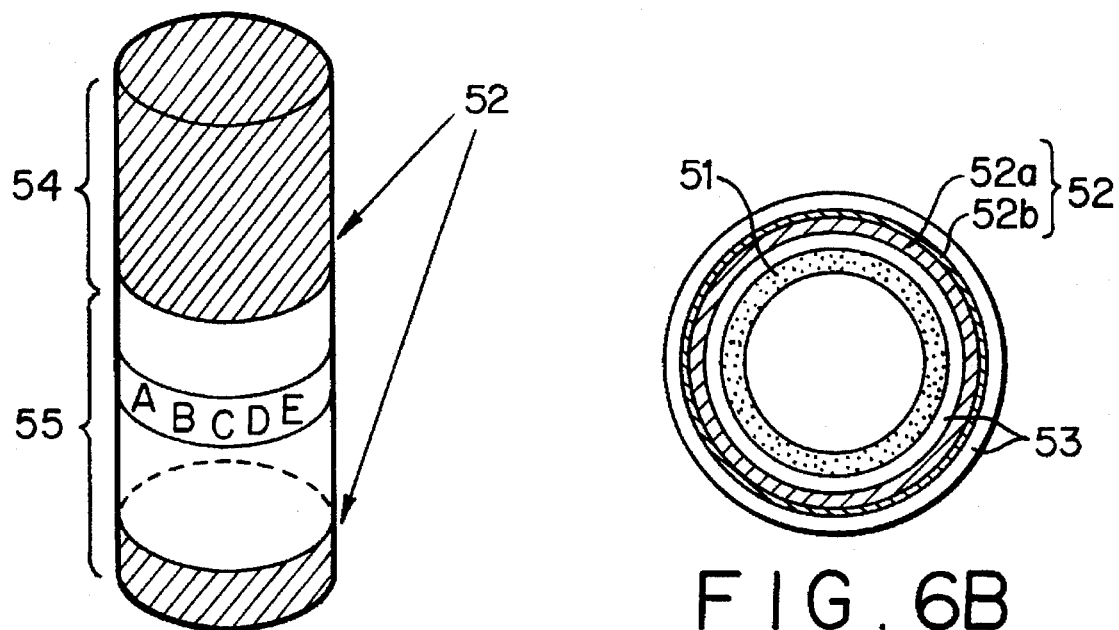
FIG. 6A
FIG. 6B

CORROSION-RESISTANT FILM FOR PROTECTING SURFACES OF AG AND CORROSION-RESIST COMPOSITE STRUCTURES

BACKGROUND OF THE INVENTION

1. Field of the Invention

The present invention relates to a corrosion-resistant film for protecting surfaces of silver (Ag), with protection from being corroded by ozone, sulfide components, etc. in air, to a composite structure composed of a Ag substrate and the above-mentioned corrosion-resistant film, which is used as a reflective film, for example, for a photo-magnetic recording medium, an optical recording medium, a reflector, an illuminator, a sign, etc. and as a plating film, for example, for a metal product, a plastic product, etc, and to a method of protecting an Ag surface from corrosion from sulfide components and ozone in air.

2. Discussion of the Background

Ag is an extremely useful metal, having a beautiful silver-white gloss and excellent ductility and malleability and having the largest electric conductivity and thermal conductivity in the group of metals. In particular, since Ag has a reflectivity of almost 100% against visible rays in a broad wavelength range, it is widely used as a reflective film for various devices needing mirror surfaces, such as in optical recording media, etc. If tableware is plated with Ag, they have improved outward appearance and microorganisms in water attached to them are killed. Ag-plated utensils have a high-quality feel and their commercial value is elevated.

As mentioned above, Ag is an extremely useful metal, which is chemically stable in that it is not oxidized even when heated at high temperatures in oxygen. However, one drawback of Ag is that it is converted into brown or black $Ag_2S$ in the presence of sulfide components in air or black AgO in the presence of ozone in air. The latter is not so remarkable as the former, with the result being that Ag shall lose its gloss. In particular, Ag directly bonds to sulfur and, for example, it reacts with $H_2S$ to be easily converted into $Ag_2S$ and blackened even at room temperature. While oppositely utilizing the blackening reaction of Ag, Ag decorations with antique colors are known but are not popular. In order to temporarily prevent such a blackening reaction of Ag, methods of treating Ag with chromates and of coating Ag with transparent resins are known. A more effective method in which Ag is plated with a thin rhodium (Rh) film is also known.

However, all of the above-mentioned known methods for preventing Ag from fading, are not satisfactory. Precisely, the chemical film to be formed on Ag by the treatment with chromates is extremely thin and it loses its activity within a relatively short period of time. It is difficult to completely remove film defects such as pin holes, etc. from the resin film to be formed on Ag. If the resin film formed on Ag has such defects, Ag is corroded through the defects. The Rh-plating method is not popular since Rh itself is very expensive. In addition, when an Ag film is used as the reflective film for a photo-magnetic recording media, etc. the thermal conductivity of the protective film is often problematic.

The present inventors have studied means of protecting Ag from being corroded by sulfide components and ozone in air and, as a result, have found that the corrosion of Ag can be effectively prevented when an Ag substrate is coated with an Ag—Mg alloy. Such an Ag—Mg alloy film has a larger residual compression stress than an Ag film and is therefore harder than the latter. However, if such an Ag—Mg alloy film is formed on a substrate or base layer, the adhesion between the film and the substrate or base layer is poor so that the former is easily peeled off from the latter. If so, the substrate or base layer is corroded through the part from which the alloy film has been peeled off. Therefore, only if an Ag film is simply substituted with such an Ag—Mg alloy film, a sufficient protecting effect can not be obtained. The present inventors have further studied the problem and, have found that when an Ag—Mg alloy film is formed on an Ag substrate as its protective film while forming an integrated structure of the Ag substrate and the Ag—Mg alloy film, that an Ag composite structure with extremely good corrosion resistance can be obtained. On the basis of these findings, we have completed the present invention.

SUMMARY OF THE INVENTION

One object of the present invention is to provide a corrosion-resistant film for protecting surfaces of Ag, with protection from being sulfurized or oxidized by sulfide components or ozone in air, while maintaining the reflectivity and the gloss of Ag itself.

Another object of the present invention is to provide a composite structure composed of an Ag substrate and a corrosion-resistant film which can favorably used as a reflective film, for example, for a photo-magnetic recording medium, an optical recording medium, a reflector, an illuminator, a sign, etc. and as a plating film, for example, for a metal product, a plastic product, etc.

Another object of the present invention is to provide a method of protecting the surface of an Ag substrate, from the corrosive effects of sulfide components or ozone in air.

Specifically, one object of the present invention is directed to a corrosion-resistant film for protecting surfaces of Ag (hereinafter referred to as a protective film), which comprises an Ag—Mg alloy having an Mg content of from 1 to 10 atomic %.

The Mg content of the protective film, as referred to herein, indicates the mean value of the Mg content throughout the entire thickness of the protective film. Therefore, even a protective film having varying Mg concentrations from the interface bonded to the Ag substrate to the uppermost surface or a protective film having different Mg concentrations partially, for example, in the interface bonded to the Ag substrate and in the parts of the uppermost surface, etc. are within the scope of the present invention. So long as the film has an Mg content within the above-mentioned range in terms of its mean value it is within the scope or the present invention.

The other object of the present invention can be attained by a corrosion-resistant composite structure composed of an Ag substrate and a protective film formed on the surface of the substrate, wherein the protective film comprises an Ag—Mg alloy having an Mg content of from 1 to 10 atomic %.

In the composite structure, it is preferred that the surface part of the protective film comprising such an Ag—Mg alloy is oxidized to be an MgO layer. This is because the protective film with such an MgO layer at its surface part exhibits a sufficient protecting effect.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 5 is a cross-sectional view showing the structure of an illuminator of one embodiment of the present invention.

FIG. 6(A) is a perspective view showing the structure of a cosmetic container of one embodiment of the present invention.

FIG. 6(B) is a cross-sectional view showing the structure of the cosmetic container of FIG. 6(A).

Figure 1:
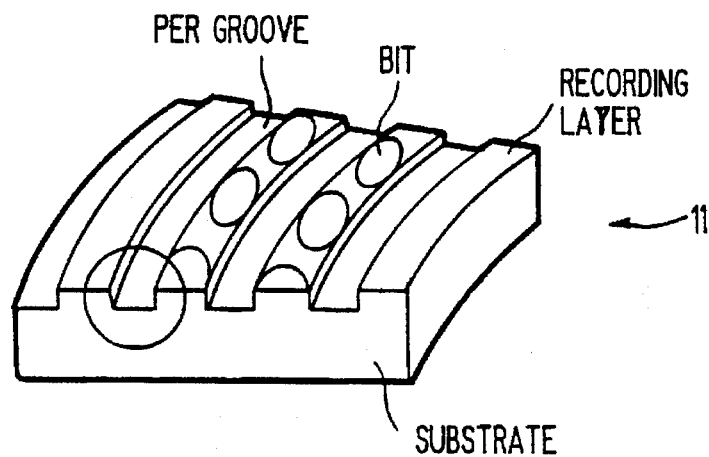
FIG. 1 is a perspective view showing the structure of a photo-magnetic disc of one embodiment of the present invention.

In these drawings, 16a is an Ag film; 16b is an Ag—Mg alloy film; 16 is a reflective layer of a photomagnetic disc; 21 is a reflective layer of an optical disc; 32 is a reflective layer of a mirror; 44 is a reflective layer of an illuminator; 52 is a plated film of a cosmetic container.

DETAILED DESCRIPTION OF THE PREFERRED EMBODIMENTS

In the composite structure of the present invention, the Ag substrate is typically in the form of a film. However, the shape of the Ag substrate is not specifically limited and the Ag substrate may also be in the form of a bulk, etc. Accordingly, according to the present invention any Ag substrate in need of protection from the atmosphere can form the basis for a composite structure according to the present invention.

The composition of the Ag substrate is primarily Ag, however, within the scope of the present invention, is any Ag containing substrate in need of protection from the corrosive effects of sulfide components and ozone in air, provided that any additional components of the Ag substrate do not substantially interfere with the formation of an Ag—Mg protective film.

It is desirable that a protective film having a thickness of 50 Å or more is formed on an Ag substrate having a thickness of 500 Å or more to produce a stable composite structure of the present invention.

The present invention also provides a reflective film comprising the above-mentioned composite structure. Such a reflective film is used in, for example, photomagnetic recording media, optical recording media, reflectors, illuminators, various signs, etc.

In the reflective film of the present invention, it is desirable that the Ag substrate is coated with an under-coat layer and/or the protective film is coated with an over-coat layer. The reflective film with such undercoat and/or over-coat layer(s) has more improved corrosion resistance. As the under-coat and over-coat layers, usable are thin films of synthetic resins, transparent dielectrics, etc.

In one embodiment of the reflective film of the present invention for photo-magnetic recording media, it is desirable that the protective film is made of an Ag—Mg alloy containing from 1 to 8 atomic % of Mg.

In another embodiment of the reflective film of the present invention for optical recording media, it is desirable that the protective film is made of an Ag—Mg alloy containing from 1 to 5 atomic % of Mg.

In another embodiment of the reflective film of the present invention for reflectors, it is desirable that the protective film is made of an Ag—Mg alloy containing from 1 to 5 atomic % of Mg. Reflectors as referred to herein include reflective devices, reflective mirrors, reflective boards, etc.

In another embodiment of the reflective film of the present invention for illuminators, it is desirable that the protective film is made of an Ag—Mg alloy containing from 1 to 5 atomic % of Mg.

In another embodiment of the reflective film of the present invention for signs, it is desirable that the protective film is made of an Ag—Mg alloy containing from 1 to 5 atomic % of The present invention also provides a plating film for plastic products, which comprises the above-mentioned composite structure. Plastic products include, for example, various household plastic utensils such as cosmetic containers, etc.

As mentioned above, the corrosion-resistant film for protecting surfaces of Ag of the present invention comprises an Ag—Mg alloy having an Mg content of from 1 to 10 atomic %. Mg to be incorporated into Ag to form such an Ag—Mg alloy is a metal having a silver-white gloss similar to the gloss of Ag, and this has good ductility and malleability and can be easily formed into foil like silver. For these reasons, Mg is suitably alloyed with silver.

Mg is easily oxidized in air at room temperature to form a stable oxide. Therefore, when a protective film comprising such an Ag—Mg alloy is subjected to oxidation or is exposed to air, Mg is selectively oxidized to form an MgO layer on its surface, while Mg on the inside of the film is consumed with the result that the Mg concentration in the inside is lowered. MgO is transparent to visible rays, and it is permeable to light but also blocks ozone and $SO_2$. Therefore, the protective film with MgO on its surface acts as an effective protective film for the Ag substrate. Since the internal composition of the protective film under the surface MgO layer is close to Ag, the reflectivity of the film shall be more similar to that of the Ag substrate.

The atomic percent of Mg of from 1 to 10 atomic percent, and of from 1 to 8 and 1 to 5 atomic percent, refer to the Mg content in the protective film, prior to the selective oxidation of Mg therein to form MgO.

When the protective film comprising the above-mentioned Ag—Mg alloy is formed on an Ag substrate, Mg is diffused in some degree into the Ag substrate with the result that the composition of the film is continuously and gradually varied and therefore the composition of the interface between the film and the Ag substrate becomes indefinite. As a result, the adhesion between the Ag—Mg protective film and the Ag substrate is good. For example, as compared with an MgO layer formed on an Ag substrate by reactive sputtering or the like, the protective film comprising the above-mentioned Ag—Mg alloy of the present invention and formed on an Ag substrate is more hardly peeled off from the Ag substrate. Thus, the protective film of the present invention exhibits a high protecting effect.

The corrosion-resistant composite structure of the present invention comprises an Ag substrate and an Ag—Mg protective film on the surface of the Ag substrate. In one embodiment where the Ag substrate is in the form of a film, the Ag film is formed on a substrate board or on an undercoat layer. In this case, the protective film of the above-mentioned Ag—Mg alloy is not formed directly on such a substrate board or an undercoat layer but is formed thereon via the Ag substrate film. Therefore, it is possible to coat any conventional substrate board or undercoat layer for Ag film with the protective film to produce a composite structure having good adhesion to the substrate board or undercoat layer. For example, as compared with a case of directly forming a film of an Ag—Mg alloy on a substrate board or on an undercoat layer in the absence of an Ag substrate (film), the composite structure of the present invention is more stable.

In one embodiment of the composite structure of the present invention, to be used as the reflective film for photo-magnetic recording media, a transparent protective layer made of a synthetic resin or the like is often provided on the reflective film. Suitable synthetic resins are those conventionally used in the art for the protection of Ag substrates, such as an acrylic resin. In this embodiment where such a transparent protective layer is formed on the layer of an oxide such as MgO but not on the layer of a metal such as Ag or the like, the transparent protective layer has much fewer defects such as voids, pin holes, etc. and has a film structure having a higher density and higher adhesiveness to the MgO layer. Therefore, this embodiment having such a transparent protective layer exhibits a much higher protecting effect.

The present invention is described in more detail hereunder with reference to the embodiments thereof.

The corrosion-resisting film for protecting surfaces of Ag of the present invention comprises an Ag—Mg alloy having an Mg content of from 1 to 10 atomic %. If the alloy is put in air or in an easily oxidizing atmosphere, for example in an atmosphere at a high temperature and a high humidity, Mg, which is more oxidizable than Ag, is preferentially oxidized to form a film of an oxide of Mg on the surface of the alloy. Since the Mg oxide film is transparent, it does not detract from the silver-white gloss of Ag and additionally functions as an effective protective film by which Ag is protected from ozone and sulfide components in air. Since Mg, existing in the vicinity of the surface part of the alloy is converted into the Mg oxide film, while the film is formed on the surface part, the internal alloy composition under the surface MgO layer becomes depleted of Mg, and the composition becomes close to pure Ag. Therefore, after the Mg oxide film has been formed on the alloy, the reflectivity of the film-coated alloy is increased to 90 to 95%, namely nearer to the reflectivity of pure Ag of 98%.

The reason why the Mg content in the alloy is defined to fall the range between 1 atomic % and 10 atomic % in the present invention is because, if it is less than the defined range, Mg cannot be formed into a film of its oxide sufficient for having a protecting effect, but if it is more than the defined range, the formation of the Mg oxide film is difficult since Mg in the surface part of the alloy will form a firm Ag—Mg intermetallic compound.

In separate embodiments of the protective film of the Ag—Mg alloy, the Mg concentration may be almost uniform throughout the whole thickness of the film or may be gradually varied in the direction of the thickness of the film, for example, in such a way that the Mg concentration is gradually increased from the interface between the film and the Ag substrate toward the outermost surface of the film. The concentration gradient of Mg toward the outermost surface of the protective film need not be linear nor perfectly uniform.

The Mg oxide film to be formed on the surface layer part of the protective film of the Ag—Mg alloy may be either a spontaneously-formed oxide film that is formed by leaving the protective film in air or a forcedly-formed oxide film that is formed by positively oxidizing the protective film at a high temperature and a high humidity, for example at 80° C. and 85% RH, for 10 hours or so.

The shape of the Ag substrate to be coated with the protective film of such an Ag—Mg alloy of the present invention is not specifically defined, and the Ag substrate may be either in the form of a bulk or in the form of a film. Typically, however, the Ag substrate is in the form of a film such as that of various reflective films or plating films.

The composite structure of the present invention is comprised of an Ag substrate and a protective film of an Ag—Mg alloy, such as that mentioned hereinabove, formed on the substrate. As examples of the composite structure, mentioned are reflective films for photo-magnetic recording media, optical recording media, reflectors, illuminators, various signs, etc., and plating films for plastic products. In the composite structure of this type, in general, it is desirable that a protective film having a thickness of 50 Å or more is formed on an Ag substrate having a thickness of 500 Å or more, preferably 1,000 Å or more. If the thickness of the Ag substrate is less than 500 Å, there is a probability that the composite structure could not have the desired gloss and reflectivity. The preferred range of the thickness of the protective film varies in some degree, depending on the use of the film, as will be mentioned hereinunder.

Where the reflective film of the present invention is used as a reflective film for photo-magnetic recording media such as photo-magnetic discs of a large-scale memory, etc., it is desirable that the protective film is made of an Ag—Mg alloy to be formed by incorporating from 1 to 8 atomic % of Mg into Ag. The reason why the alloy is defined to have the composition range is because the thermal conductivity of the alloy film shall be not more than ⅔ of that of the Ag substrate and the reflectivity of the former shall be not less than 80%.

Figures 2A, 2B:
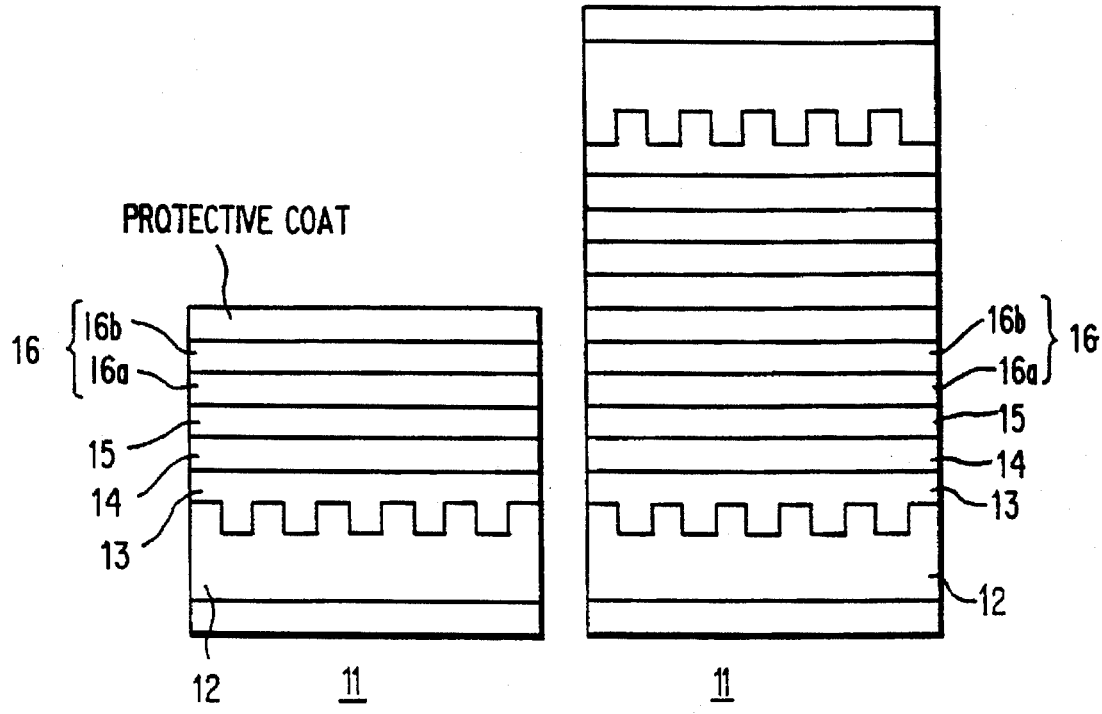
FIG. 2(A) and FIG. 2(B) each are a cross-sectional view showing the structure of a photo-magnetic disc of one embodiment of the present invention.

FIG. 1, FIG. 2(A) and FIG. 2(B) show embodiments of the present invention where the composite structure of the invention is used as the reflective film in a photomagnetic disc. In these drawings, 11 is a photo-magnetic disc, in which a recording layer 14 is laminated on a polycarbonate (PC) substrate board 12 via a protective layer 13, and a reflective layer 16 is laminated on the recording layer 14 via a protective layer 15. The reflective layer 16 is made of the composite structure of the invention, which is composed of an Ag film 16a and an Ag—Mg alloy film 16b formed on the Ag film 16a. The Ag—Mg alloy film 16b is made of an Ag—Mg alloy comprising from 1 to 8 atomic % of Mg, and its thickness is suitably 50 Å or more. The thickness of the Ag film 16a is suitably 500 Å or more. It is desirable that the total of the thickness of the Ag film and the thickness of the Ag—Mg film is from 500 to 1,000 Å. The protective layer may be made of SiAlON, Si$_3$N$_4$ or the like. The recording layer may be made of TbFeCo, TbFeCoCr or the like. The thickness of the recording layer may be from 200 to 250 Å. FIG. 2(A) shows the structure of a 3.5-inch photo-magnetic disc; and FIG. 2(B) shows the structure of a 5.25-inch photomagnetic disc. The reflective film of the present invention may be used in either of these.

Where the reflective film of the present invention is used as a reflective film for optical recording media, such as optical discs (CD), optical cards, etc., it is desirable that the protective film is made of an Ag—Mg alloy to be formed by incorporating from 1 to 5 atomic % of Mg into Ag. The reason is because the reflectivity of the alloy film shall be 90% or more.

Figure 3:
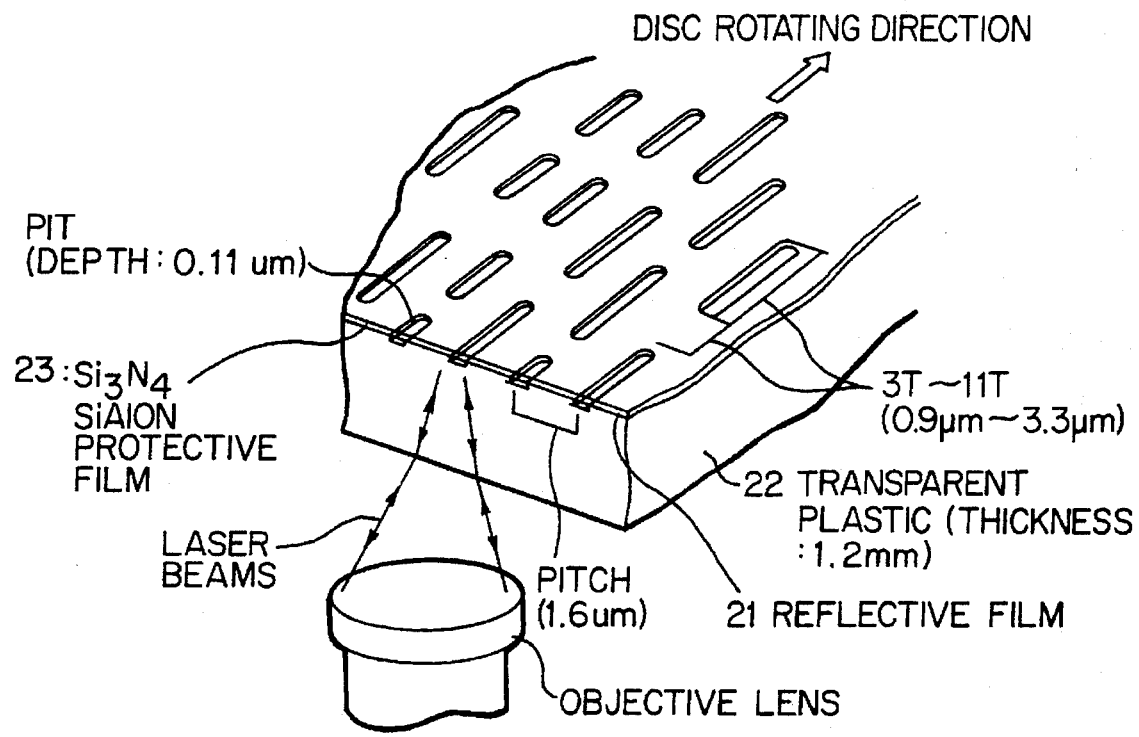
FIG. 3 is a perspective view showing the structure of a compact disc, a kind of optical disc of one embodiment of the present invention.

FIG. 3 shows an embodiment of the present invention where the reflective film of the invention has been applied to an optical disc. In this drawing, a reflective film 21 has been laminated on a transparent plastic substrate board 22, and the film 21 has been coated with a protective film 23. The reflective film 21 is made of the composite structure of the invention, which is composed of an Ag film and an Ag—Mg alloy film formed on the Ag film. The Ag—Mg alloy film is made of an Ag—Mg alloy containing from 1 to 5 atomic % of Mg, and its thickness is suitably 50 Å or more. The thickness of the Ag film is suitably 500 Å or more. The protective film may be made of SiAlON, Si$_3$N$_4$ or the like.

Where the reflective film of the present invention is used as a reflective film for reflectors, it is desirable that the protective film is made of an Ag—Mg alloy to be formed by incorporating from 1 to 5 atomic % of Mg into Ag. The reason is because the reflectivity of the alloy film is preferably 90% or more.

Figure 4:
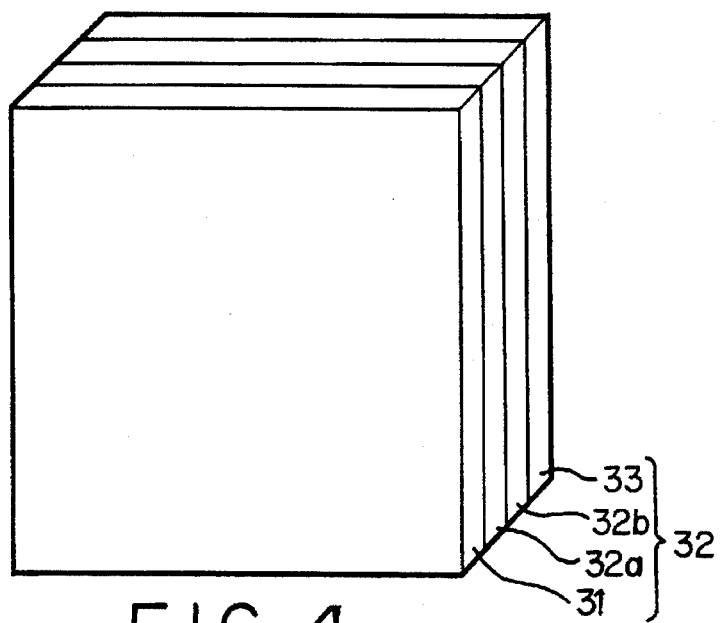
FIG. 4 is a perspective view showing the structure of a mirror of one embodiment of the present invention.

FIG. 4 shows an embodiment of the present invention where the reflective film of the invention has been applied to a mirror (for household use or for cars, etc.) as one example of reflectors. In the illustrated mirror, a reflective film 32 has been attached to a flat glass sheet 31, and the film 32 has been coated with a protective resin coat layer 33. The reflective film 32 is composed of an Ag film having a thickness of 500 Å or more and an Ag—Mg alloy film formed on the Ag film. The Ag—Mg alloy has a thickness of 50 Å or more and contains from 1 to 5 atomic % of Mg. It is desirable that the sum of the thickness of the Ag film and the thickness of the Ag—Mg alloy film is from 500 to 1,000 Å. If having the composition within the defined range, the reflective film can have much more improved corrosion resistance while having a reflectivity comparable to the reflectivity of conventional mirrors having reflective films made of Al or Cr.

Where the reflective film of the present invention is used as a reflective film for illuminators or for signs, it is desirable that the protective film is made of an Ag—Mg alloy to be formed by incorporating from 1 to 5 atomic % of Mg into Ag. The reason is because the reflectivity of the alloy film is preferably 90% or more.

FIG. 5 shows a cross-sectional view of an illuminator having a reflective film of the present invention, in which 41 is a substrate board made of SG. The substrate board 41 is laminated with a reflective film 44 via an adhesive layer 42 and an adhesive-covering layer 43 therebetween. The reflective film 44 is composed of an Ag film having a thickness of 500 Å or more and an Ag—Mg alloy layer formed on the Ag film. The Ag—Mg alloy layer has a thickness of 50 Å or more and is made of an Ag—Mg alloy containing from 1 to 5 atomic % of Mg. It is desirable that the sum of the thickness of the Ag film and the thickness of the Ag—Mg alloy film is from 1,000 to 2,000 Å. In the drawing, 45 is a top-coat layer. If desired, the reflective film of this type composed of an Ag film and an Ag—Mg alloy film may be attached to an acrylic resin substrate.

Where the composite structure of the present invention is used as a plating film for plastic products such as cosmetic containers, accessories, etc., it is desirable that the protective film is made of an Ag—Mg alloy containing from 1 to 5 atomic % of Mg. The reason is because the reflectivity of the alloy film is preferably 90% or more.

FIG. 6(A) and FIG. 6(B) show an embodiment of the present invention where the composite structure of the invention is used as the plating film for a cosmetic container as one example of plastic products for household use. In this embodiment, a plating film 52 has been formed on the surfaces of the container body 55 and the cap 54. The structure of the container is such that a cylindrical plastic substrate 51 is coated with the plating film 52. The plating film 52 has been sandwiched between transparent resin layers 53. The plating film is composed of an Ag film 52a having a thickness of 500 Å or more and an Ag—Mg alloy film 52b formed on the outer surface of the Ag film 52a. The alloy film 52b has a thickness of 50 Å or more and contains from 1 to 5 atomic % of Mg. It is desirable that the sum of the thickness of the Ag film and the thickness of the Ag—Mg alloy film is from 1,000 to 10,000 Å.

Next, a method of forming the protective film of an Ag—Mg alloy of the present invention is described below.

To form the protective film of an Ag—Mg alloy on an Ag substrate such as that mentioned hereinabove, usable are a sputtering method, a vacuum evaporation method, an ion plating method, etc. of these, preferably usable are a sputtering method, especially a magnetron sputtering method. The sputtering method is preferred to the others in that it is easy to vary the composition of the alloy to be formed on the Ag substrate simply by increasing or decreasing the high-frequency power to be applied to the targets or by moving the substrate to be coated, the adhering power of the film to the substrate is high and that it is easy to form an even film having a uniform thickness and a uniform composition on a substrate having a large area. For example, where the present invention is applied to the production of the above-mentioned reflective films for photo-magnetic discs, CD, illuminators, etc., the reflective films are formed essentially according to the magnetron sputtering. To produce plating films for household plastic utensils, reflective films for mirrors, etc., the vacuum evaporation and ion plating may be employed.

Where the Ag substrate to be coated with the protective Ag—Mg alloy film is in the form of a film, it is possible to continuously form the Ag substrate and the protective Ag—Mg film by sputtering without having the substrate and the film exposed to air during the course of sputtering.

To form the protective Ag—Mg film by sputtering, it is possible to use an Ag target and an Mg target for co-sputtering or use an Ag—Mg alloy target.

Examples of forming a protective Ag—Mg alloy film on an Ag substrate by such sputtering are mentioned hereinunder.

Figure 7:
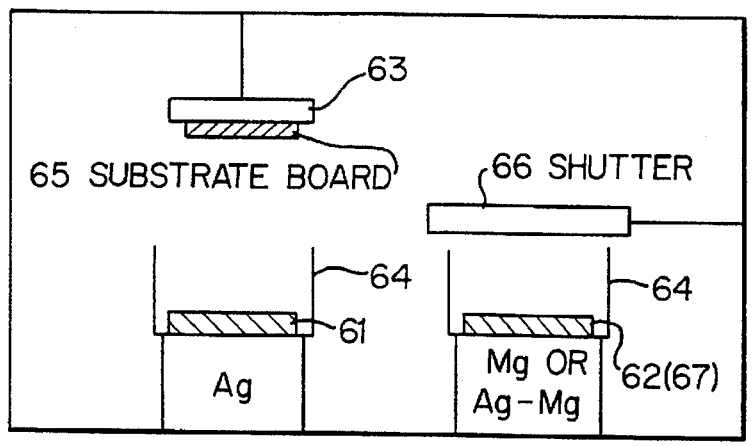
FIG. 7 is a schematic view showing one condition of the sputtering device to be used in the examples of the present invention.

Co-sputtering with an Ag target and an Mg target may be conducted in the manner mentioned below. As shown in FIG. 10, an Ag target 61 having a diameter of 5 inches, an Mg target 62 having a diameter of 5 inches and a substrate board holder 63 having a diameter of 4 inches are separately disposed each at a distance of 140 mm from the center of a chamber. The substrate is disposed above the targets at a height of 70 mm from the targets. In the drawing, the angle η is 120°. As shown in FIG. 7, a cylindrical shield 64 having a height of 50 mm has been applied to both the Ag target and the Mg target, which is to prevent the surface of either target from being contaminated due to the particles sputtered by the other target and scattering in the lateral direction.

Regarding the sputtering power, the power to be applied to the Ag target is RF 200 W and that to be applied to the Mg target is RF 200 W. The substrate board holder is rotated at 10 rpm.

First, a substrate board 65 is set above the Ag target, as shown in FIG. 7. In this situation, θ=0° in FIG. 10. Above the Mg target, a shutter 66 having a diameter of 160 mm is set at a height of 60 mm from the target.

Figure 8:
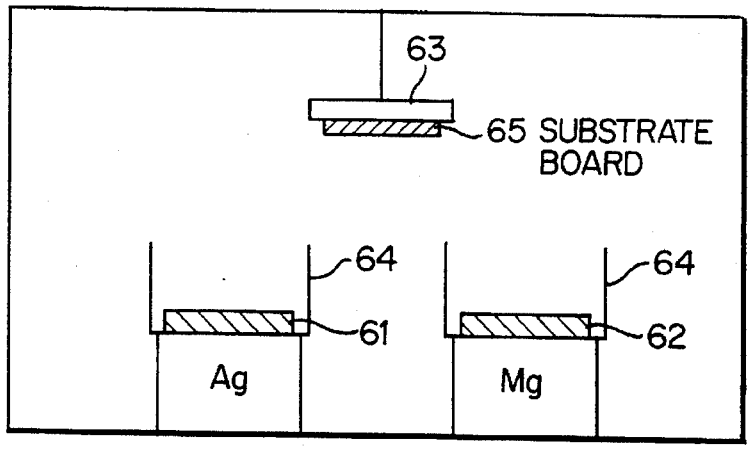
FIG. 8 is a schematic view showing another condition of the sputtering device to be used in the examples of the present invention.

At the intended final vacuum degree of $5 \times 10^{-7}$ Torr, Ar gas is introduced into the chamber by which the vacuum degree is made $1 \times 10^{-3}$ Torr, and the sputtering is started. The temperature of the substrate board is set at room temperature (25° C.±3° C.), and an Ag film is formed on the substrate board at a predetermined thickness, for example, 1000 Å. Next, as shown in FIG. 8, the substrate board is reset between the Ag target and the Mg target. In this situation, θ is from 0° to 40° in FIG. 10. While resetting the substrate board, the shutter above the Mg target is removed. In this way, the condition of the position of the substrate board and the shutter are varied at the same time. Subsequently, an Ag—Mg film is formed on the Ag film on the substrate board at a predetermined thickness, for example, 50 Å. The composition of the Ag—Mg alloy film thus formed contains, for example, 2.4 atomic % of Mg when θ=20°. Where the Ag—Mg alloy film thus formed is desired to be oxidized, the thus-coated substrate board is, without being kept as it is, immediately heated at a high temperature and at a high humidity or at a high temperature and at a high humidity under high pressure. Alternatively, the thus-coated substrate board is, without being exposed to air, heated in the presence of $O_2$ in the sputtering chamber. The concentration of $O_2$ is selected so as to produce the desired MgO film, under the chosen time and reaction conditions.

Figure 11A:
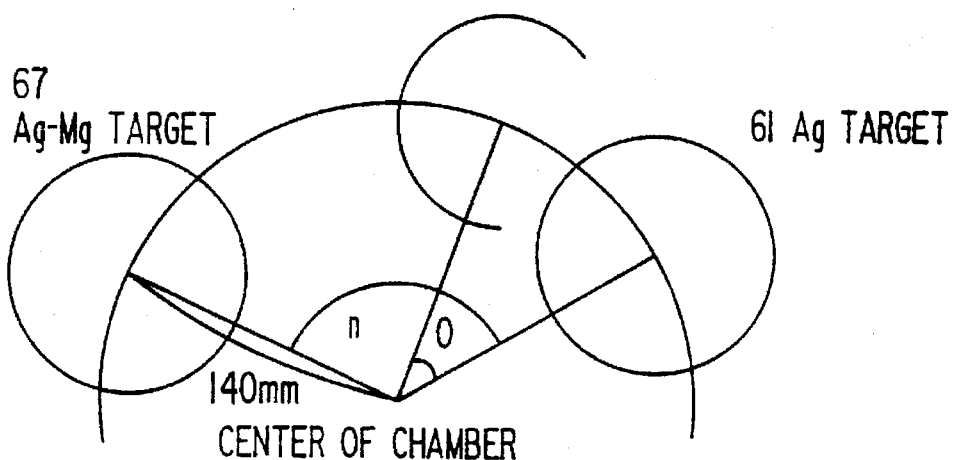
FIG. 11(A) and FIG. 11(B) are schematic views showing the mechanism and the constitution of the sputtering device to be used in the examples of the present invention, which are different from those in FIG. 10(A) and FIG. 10(B).
Figure 11B:
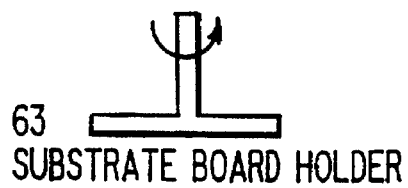

Sputtering with an Ag—Mg alloy target may be conducted in the manner mentioned below. As shown in FIG. 11, an Ag target 61 having a diameter of 5 inches, an Ag—Mg target 67 (with Mg of from 2 to 20 atomic %) having a diameter of 5 inches and a substrate board holder 63 having a diameter of 4 inches are separately disposed each at a distance of 140 mm from the center of the chamber. The substrate is disposed above the targets at a height of 70 mm from the targets. In the drawing, the angle η is 120°. As shown in FIG. 7, a cylindrical shield 64 having a height of 50 mm has been applied to both the Ag target and the Ag—Mg target, which is to prevent the surface of either target from being contaminated due to the particles sputtered by the other target and scattering in the lateral direction.

Regarding the sputtering power, the power to be applied to the Ag target is RF 200 W and that to be applied to the Ag—Mg target is RF 200 W. The substrate board holder is rotated at 10 rpm.

First, a substrate board 65 is set above the Ag target, as shown in FIG. 7. In this situation, θ=0° in FIG. 11. Above the Ag—Mg target, a shutter 66 having a diameter of 160 mm is set at a height of 60 mm from the target.

Figure 9:
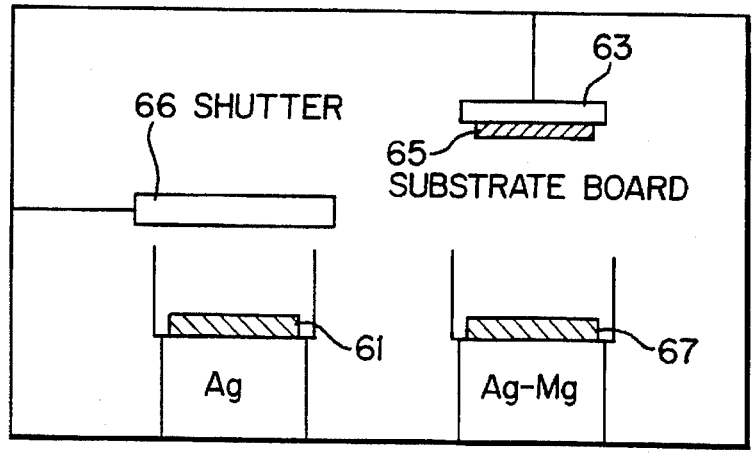
FIG. 9 is a schematic view showing still another condition of the sputtering device to be used in the examples of the present invention.
Figure 10A:
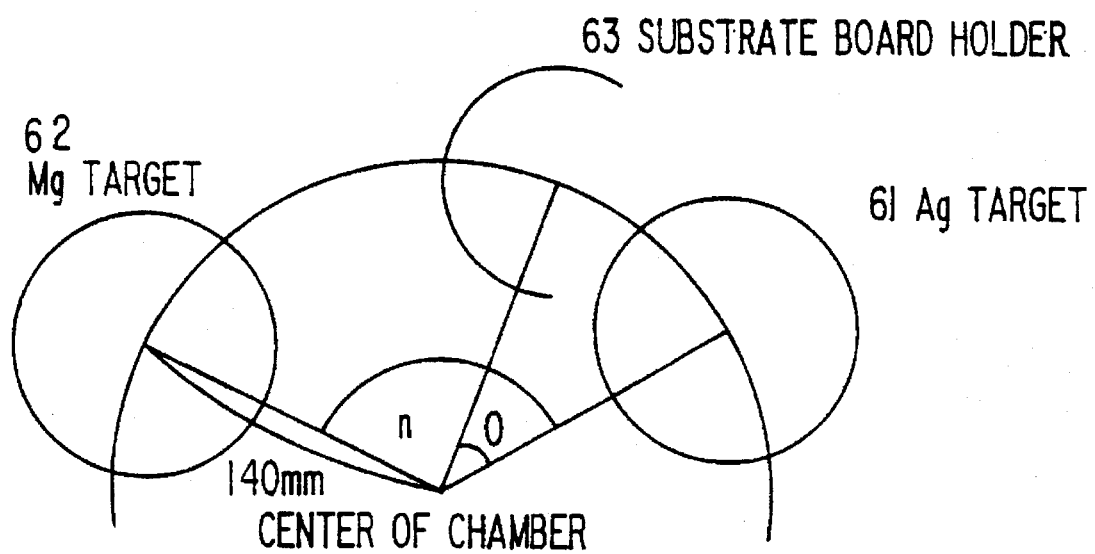
FIG. 10(A) and FIG. 10(B) are schematic views showing the mechanism and the constitution of the sputtering device to be used in the examples of the present invention.
Figure 10B:
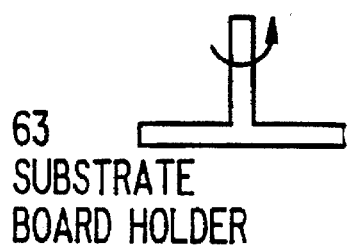
Figure 10B:
Figure 10B:

At the intended final vacuum degree of $5 \times 10^{-7}$ Torr, Ar gas is introduced into the chamber by which the vacuum degree is made $1 \times 10^{-3}$ Torr, and the sputtering is started. The temperature of the substrate board is set at room temperature (25° C.±3° C.), and an Ag film is formed on the substrate board at a predetermined thickness, for example, 1,000 Å. Next, as shown in FIG. 9, the substrate is reset above the Ag—Mg target. In this situation, θ is from 120° in FIG. 10. While resetting the substrate, the shutter above the Ag—Mg target is reset above the Ag target. In this way, the condition of the position of the substrate board and the shutter are varied at the same time. Subsequently, an Ag—Mg film is formed on the Ag film on the substrate board at a predetermined thickness, for example, 50 Å. The composition of the Ag—Mg alloy film thus formed contains, for example, 2.4 atomic % of Mg when the Ag—Mg target contains 5.0 atomic % of Mg. Where the Ag—Mg alloy film thus formed is desired to be oxidized, the thus-coated substrate board is, without being kept as it is, immediately heated at a high temperature and at a high humidity or at a high temperature and at a high humidity under high pressure. Alternatively, the thus-coated substrate board is, without being exposed to air, heated in the presence of $O_2$ in the sputtering chamber.

EXAMPLE 1

According to the above-mentioned sputtering method, an Ag film having a thickness of 1000 Å and an Ag—Mg alloy film with an Mg content of 12.0 atomic % or 2.4 atomic % having a thickness of 1000 Å or 50 Å were formed in this order on a glass substrate board (7059F, produced by Corning Co.) to produce test samples, which were then subjected to a corrosion resistance test.

The corrosion resistance test was carried out as follows: The test samples were put in a thermostat container having a settled temperature of 80° C. and a settled humidity of 85% RH for 10 hours, whereupon transition in the reflectivity of each sample was measured with the lapse of time. To measure the reflectivity of each sample, a spectrophotometer was used. As the comparative samples, were a sample having only an Ag film with a thickness of 1000 Å on the same substrate board and a sample having only an Ag—Mg alloy film (Mg content: 2.4 atomic %) with a thickness of 1000 Å on the same substrate board.

The test results are shown in Table 1 below.

TABLE 1

| Test Sample | Reflectivity (%) | | |
|---|---|---|---|
| | Fresh Sample (immediately after having been coated) | After 10 hours | After 100 hours |
| Ag 1000 Å/Substrate Board | 93.30 | 91.40 | 76.57 |
| Ag—Mg (2.4 atomic % Mg) 1000 Å/Substrate Board | 85.67 | 76.69 | 70.89 |
| Ag—Mg (12.0 atomic % Mg) 1000 Å/Ag 1000 Å/Substrate Board | 70.58 | 58.65 | 53.35 |
| Ag—Mg (2.4 atomic % Mg) 1000 Å/Ag 1000 Å/Substrate Board | 88.04 | 85.41 | 83.72 |
| Ag—Mg (2.4 atomic % Mg) 50 Å/Ag 1000 Å/Substrate Board | 90.96 | 90.80 | 91.45 |

Remarks: Reflectivity
(1) The reflectivity of each sample was measured by spectrophotometry
(2) According to the integrating sphere system using a white alumina board as the reference reflective board, the relative reflectivity of each sample was measured.

(3) Reflectivity=(energy of reflected rays)/(energy of incident rays) ( %)

As shown in Table 1 above, the test sample of the present invention having an Ag—Mg alloy film (Mg content: 2.4 atomic with a thickness of 50 Å on the Ag film had good corrosion resistance and its reflectivity did not almost decrease even though it was kept under severe conditions.

EXAMPLE 2

Next, an undercoat layer of a transparent resin having a thickness of 1μ, an Ag film having a thickness of 500 Å, an Ag—Mg alloy film (Mg content: 2.4 atomic %) having a thickness of 500 Å, and an over-coat of a transparent resin having a thickness of 1μ were formed in this order on a glass substrate board to produce a test sample. This was subjected to a forced corrosion test by salt spraying. The test was carried out as follows: An aqueous solution of sodium chloride having a concentration of 40 g/liter and having pH of from 6.5 to 7.2 was sprayed over the test sample at 35° C.±2° C. for 8 hours. After 10 hours, the same spraying was applied to the test sample. This cycle was repeated three times. After the cycle spraying, the condition of the test sample was observed with the naked eye.

After the test, the sample did not vary at all in terms of its gloss, etc. On the other hand, a comparative sample having an undercoat layer of a transparent resin with a thickness of 1μ, an Ag film with a thickness of 1000 Å and an over-coat of a transparent resin with a thickness of 1μ formed on the same substrate board in this order was subjected to the same forced corrosion test by salt spraying. After the test, the Ag film of the control sample were wholly whitened. It was obvious that the comparative sample was corroded.

The above-mentioned test results suggest the following: The oxide film formed on the surface of the Ag—Mg alloy is well compatible with the material of the over-coat. As compared with the over-coat directly formed on the Ag film, the over-coat formed on the Ag—Mg alloy film has few defects such as pin holes, etc. and therefore has a good protecting effect. In other words, the corrosion resistance of the test sample of the present invention has been improved. Therefore, it is considered that the forced oxidation of the surface of the Ag—Mg alloy film in the sample of the present invention is effective for the purpose of further improving the corrosion resistance of the sample.

As has been described in detail hereinabove, the present invention provides a protective film of an Ag—Mg alloy having an Mg content of from 1 to 10 atomic %, which is used to protect an Ag substrate. The surface of the protective film is oxidized to form an Mg oxide film thereon, and the protective film with such an Mg oxide film on its surface effectively acts to protect the underlying Ag substrate from being corroded by ozone and sulfides in air. The reflectivity of the Ag substrate coated with the protective film is not substantially lowered. The adhesiveness between the Ag substrate and the protective Ag—Mg alloy film is good. The composite structure composed of the Ag substrate and the protective Ag—Mg alloy film may be applied to any conventional substrate board or under-layer and the adhesiveness between the composite structure and the substrate board or under-layer is good. Therefore, the present invention also provides such composite structure which is useful, for example, as a reflective film for photo-magnetic recording media, optical recording media, reflectors, illuminators, signs, etc. or as a plating film for plastic products, etc.

The reflective film comprising the composite structure of the present invention may be coated with a transparent protective layer. In this case, the adhesiveness between the transparent protective layer and the reflective film of the invention having an oxide such as MgO on its surface is higher than that between such a transparent protective layer and a metal such as Ag. Therefore, the transparent protective film coated over the reflective film of the invention has fewer surface defects such as voids, pin holes, etc. than that coated over a metal such as Ag, and the film structure of the former where the transparent protective film has been coated over the reflective film of the invention has a higher density and higher adhesiveness and therefore has a higher protecting effect than that of the latter where the transparent protective film has been coated over a metal such as Ag.

Obviously, numerous modifications and variations of the present invention are possible in light of the above teachings. It is therefore to be understood that within the scope of the appended claims, the invention may be practiced otherwise than as specifically described herein.

This application is based on Japanese patent application HEI 6-203875, filed in the Japanese patent office on Aug. 29, 1994, the entire contents of which are hereby incorporated by reference.

What is claimed as new and is desired to be secured by Letters Patent of the United States is:

1. A method of protecting an Ag surface from the corrosive effects of sulfide component and ozone of air comprising applying to an external surface of said Ag, an Ag—Mg alloy having an Mg content of from 1 to 10 atomic %, wherein Mg is diffused into said Ag surface; and oxidizing a surface part of said protective film of said Ag—Mg alloy to form an MgO layer on an external surface of said protective film wherein Mg is diffused from a surface of said Ag—Mg alloy opposite to an interface between said Ag surface and said Ag—Mg alloy wherein said protective film has a thickness of 50 Å or more.

2. The method of claim 1, wherein said Ag surface is a substrate in the form of a film.

3. The method of claim 2, wherein said Ag substrate has a thickness of 500 Å or more.

4. The method of claim 2, wherein said Ag substrate and said protective film are contiguous.

5. The method of claim 2, wherein said Ag substrate and said protective film are continuously contiguous.

6. A method of protecting an Ag surface from the corrosive effects of sulfide component and ozone of air comprising applying to an external surface of said Ag, an Ag—Mg alloy having an Mg content of from 1 to 10 atomic %, wherein Mg is diffused into said Ag surface; and oxidizing a surface part of said protective film of said Ag—Mg alloy to form an MgO layer on an external surface of said protective film wherein said protective film has a thickness of 50 Å or more.

7. The method of claim 1, wherein said Ag—Mg alloy has an Mg content of from 1 to 5 atomic %.

* * * * *

UNITED STATES PATENT AND TRADEMARK OFFICE
CERTIFICATE OF CORRECTION

PATENT NO. : 5,630,886
DATED : May 20, 1997
INVENTOR(S) : Kenichi Hijikata, et. al.

It is certified that error appears in the above-indentified patent and that said Letters Patent is hereby corrected as shown below:

Column 4, line 34, after "of" insert --Mg.-- .

Signed and Sealed this

Thirtieth Day of June, 1998

Attest:

BRUCE LEHMAN

Attesting Officer     Commissioner of Patents and Trademarks